United States Patent
Chen (10) Patent No.: US 8,460,567 B2
(45) Date of Patent: Jun. 11, 2013

(54) METHOD AND SYSTEM FOR ETCHING A MEM DEVICE

(75) Inventor: Lee Chen, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 1196 days.

(21) Appl. No.: 12/165,801

(22) Filed: Jul. 1, 2008

(65) Prior Publication Data
US 2010/0000964 A1    Jan. 7, 2010

(51) Int. Cl.
    *B44C 1/22*   (2006.01)
(52) U.S. Cl.
    USPC ............... 216/67; 216/63; 438/710; 438/712; 438/714
(58) Field of Classification Search
    USPC ..................... 156/345.35, 345.39, 345.43
    See application file for complete search history.

(56) References Cited

U.S. PATENT DOCUMENTS

| | | | |
|---|---|---|---|
| 2004/0053505 A1* | 3/2004 | Chinn et al. | 438/710 |
| 2006/0065367 A1* | 3/2006 | Chen et al. | 156/345.33 |
| 2007/0023398 A1* | 2/2007 | Kobayashi et al. | 219/69.12 |
| 2008/0085604 A1 | 4/2008 | Hoshino et al. | |

OTHER PUBLICATIONS

Wolf et al., Silicon Processing for the VLSI Era, vol. 1, 2nd edition, Lattice Press, 2000, pp. 668-669.*

* cited by examiner

*Primary Examiner* — Lan Vinh
*Assistant Examiner* — Jiong-Ping Lu
(74) *Attorney, Agent, or Firm* — Manuel B. Madriaga (57) ABSTRACT

A method and system for etching a substrate is described and, in particular, a method for etching large, high aspect ratio features, such as those in micro-electromechanical devices (MEMs), is also described. The method comprises disposing a substrate in a processing system, forming plasma having a substantial population of negatively-charged ions, and etching one or more features in the substrate using the negative ion population.

16 Claims, 8 Drawing Sheets

METHOD AND SYSTEM FOR ETCHING A MEM DEVICE

BACKGROUND OF THE INVENTION

1. Field of the Invention

The invention relates to a method and system for etching a substrate. In particular, the invention relates to a method and system for etching large, high aspect ratio features in a substrate, such as those in micro-electromechanical devices (MEMs).

2. Description of Related Art

During semiconductor processing, plasma is often utilized to assist etch processes by facilitating the anisotropic removal of material along fine lines or within vias (or contacts) patterned on a semiconductor substrate. Examples of such plasma assisted etching include: (1) reactive etching with reactive radicals formed by plasma dissociation; (2) reactive ion etching (RIE) with reactive ions; and (3) ion assisted reactive etching with ions and radicals. In order to produce anisotropic features, the etching process must fall into one of the latter two categories.

In plasma assisted etching, fine patterns formed in a thin lithographic mask layer are transferred to an underlying layer on the substrate. For example, the lithographic mask layer is formed by applying a thin layer of radiation-sensitive material, such as photoresist, to an upper surface of the substrate, and exposing the radiation-sensitive material to a pattern of electromagnetic radiation. Thereafter, the fine pattern formed in the mask layer is transferred to the underlying thin film on the substrate during etching.

However, conventional plasma processes utilize electropositive plasma discharge (i.e., ion-electron plasma). In electropositive plasma, the region between the outermost portion of the plasma which has substantially equal numbers of ions and electrons over any arbitrary incremental volume thereof and a plasma confining surface (that causes a boundary condition) may be referred to as the "plasma sheath". The thickness of the plasma sheath is on the order of the Debye length which corresponds to the characteristic distance over which significant charge densities may spontaneously exist.

For an electropositive plasma, the ion-electron plasma Debye length ($\lambda_{d,ie}$) may be expressed as:

$$\lambda_{d,ie} = [(\epsilon_o T_e)/(n_e q)]^{1/2}, \quad (1)$$

where $\epsilon_o$ is the permittivity of free space, q is the charge of an electron, $T_e$ is the electron temperature, and $n_e$ is the electron density. For example, electropositive plasma having an electron temperature of $T_e \sim 1$ eV and an electron density of $n_e \sim 1 \times 10^{12}/cm^3$, the Debye length is approximately 7.4 microns.

When etching large, high aspect ratio features, such as those encountered during processing of micro-electromechanical (MEM) devices, the sheath thickness (or Debye length) becomes about equal to or less than the transverse dimension of the feature being etched. As a result, the sheath edge is perturbed while etching the feature and the bulk plasma presses towards the interior of the feature.

Figure 1A:
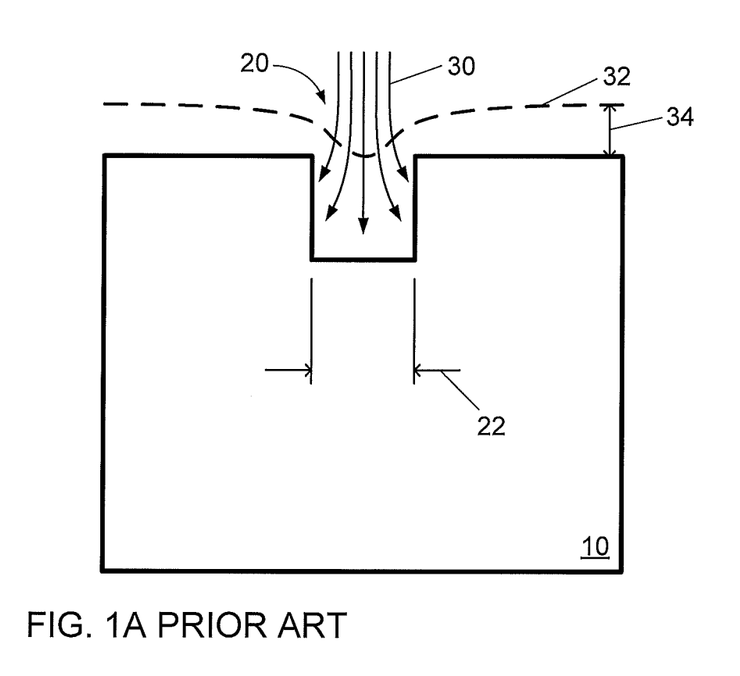
FIGS. 1A and 1B provide a schematic illustration of an etching process.
Figure 1B:
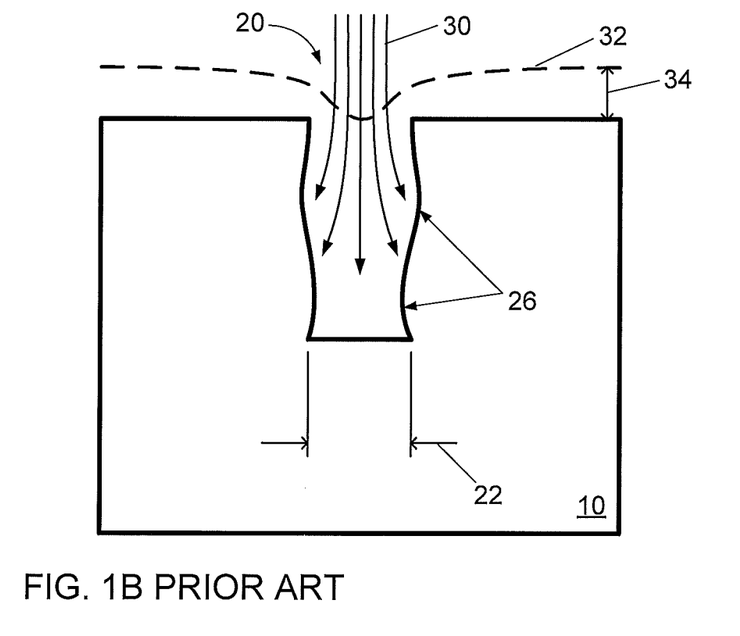

For example, FIGS. 1A and 1B illustrate an etching process for a large, high aspect ratio feature using electropositive plasma. A feature 20 is etched into a substrate 10, wherein an ion flux 30 passes through plasma sheath 32, adjacent substrate 10, and assists the etching chemistry at the bottom of the feature 20. As shown in FIG. 1A, the transverse dimension 22 of feature 20 is larger than the thickness 34 of plasma sheath 32 and, therefore, the edge of plasma sheath 32 is perturbed as plasma enters feature 20. Consequently, the ion trajectories of ion flux 30 are varied due to the perturbation of plasma sheath 32 into feature 20, and some of these ion trajectories strike the sidewalls of feature 20. This bending of ion trajectories causes non-anisotropic etching of feature 20.

At present, one approach to counter this effect is the well-known Bosch process. In the Bosch process, pseudo-anisotropic features are produced by a two-step process that includes alternatingly and repeatedly performing an etching process followed by a film forming process. However, the Bosch process results in a limited etch rate and the formation of undulations 26 (see FIG. 1B) due to the alternating etching and film forming steps. Further, if the etch rate is increased by prolonging the time period for the etching step, the size of undulations 26 worsens.

SUMMARY OF THE INVENTION

The invention relates to a method and system for etching a substrate. In particular, the invention relates to a method and system for etching large, high aspect ratio features in a substrate, such as those in micro-electromechanical (MEM) devices.

Furthermore, the invention relates to a method and system for etching a substrate, comprising: disposing a substrate in a processing system; forming plasma having a substantial population of negatively-charged ions; and etching one or more features in the substrate using the negative ion population.

According to an embodiment, a method of etching a substrate is described, comprising: disposing a substrate in a processing system; forming plasma in the processing system; extracting electrons from the plasma; collision-quenching the electrons in order to form less energetic electrons; forming a quiescent plasma with a population of negatively-charged ions using the less energetic electrons; and etching one or more features in the substrate by exposing the substrate to the population of negatively-charged ions in the quiescent plasma.

According to another embodiment, a method of etching a micro-electromechanical (MEM) device is described, comprising: disposing a substrate in a processing system; introducing a process gas to the processing system, the process gas having a halogen-containing gas; forming a continuous plasma from the process gas, the plasma comprising a population of negatively-charged ions; and etching one or more features in the substrate by exposing the substrate to the population of negatively-charged ions.

According to yet another embodiment, an etching system is described, comprising: a first chamber configured to receive a first process gas and operate at a first pressure; a first gas injection system coupled to the first chamber and configured to introduce the first process gas; a plasma generation system coupled to the first chamber and configured to form plasma from the first process gas; a second chamber coupled to the first chamber; an optional second gas injection system coupled to the second chamber and configured to introduce a second process gas to the second chamber at a second pressure; a separation member disposed between the first chamber and the second chamber, wherein the separation member comprises one or more openings configured to supply electrons from the plasma in the first chamber to the second chamber in order to form a quiescent plasma in the second chamber; a substrate holder coupled to the second chamber and spaced a distance from the separation member, wherein the substrate holder is configured to support a substrate and expose the substrate to the quiescent plasma; and a pressure control system coupled to the second chamber, and configured to control the second pressure such that the electrons from the first chamber undergo collision-quenching to form less energetic electrons that produce the quiescent plasma with negatively-charged ions in the second chamber, wherein the first process gas or the second process gas or both comprise at least one electronegative gaseous specie.

According to yet another embodiment, a method of etching a substrate is described, comprising: disposing a substrate in a processing system; forming plasma having a substantial population of negatively-charged ions; and etching one or more features in the substrate using the negative ion population, wherein a critical dimension of the one or more etched features is greater than or equal to 1 micron, and wherein a plasma sheath thickness for the plasma adjacent the substrate is greater than or equal to the critical dimension.

DETAILED DESCRIPTION OF EXEMPLARY EMBODIMENTS

In the following description, for purposes of explanation and not limitation, specific details are set forth, such as particular plasma processing systems and the components used therein. However, it should be understood that the invention may be practiced in other embodiments that depart from these specific details.

According to an embodiment, a method and system is described for etching a substrate. In particular, a method and system is described for etching large, high aspect ratio features in a substrate, such as those in micro-electromechanical devices (MEMs). The term "large" may be used herein to describe features having a critical dimension greater than or equal to about 0.5 micron, for example, and the term "high aspect ratio" may be used to describe features having an aspect ratio (ratio of longitudinal dimension to lateral dimension) greater than or equal to 1:1. The method and system for etching a substrate comprises forming a continuous plasma having a substantial population of negatively-charged ions, and etching one or more features in the substrate using the negative ion population.

The term "continuous plasma" is used herein to describe plasma that is not pulse time modulated. In a pulse time modulated plasma, the plasma sheath thickness is also modulated causing the ion energy distribution at the substrate to broaden.

Furthermore, negative ion plasma may be used herein interchangeably with ion-ion plasma. Negative ion plasma or ion-ion plasma comprise a substantial population of negatively-charged ions and, thus, charge balance in the bulk plasma requires a balance between the population of positively-charged ions and the sum of the populations of negatively-charged ions and free electrons. In electronegative plasma, the population of negatively-charged ions results in a thicker plasma sheath or greater Debye length (relative to that of electropositive plasma (ion-electron plasma)).

Figure 2:
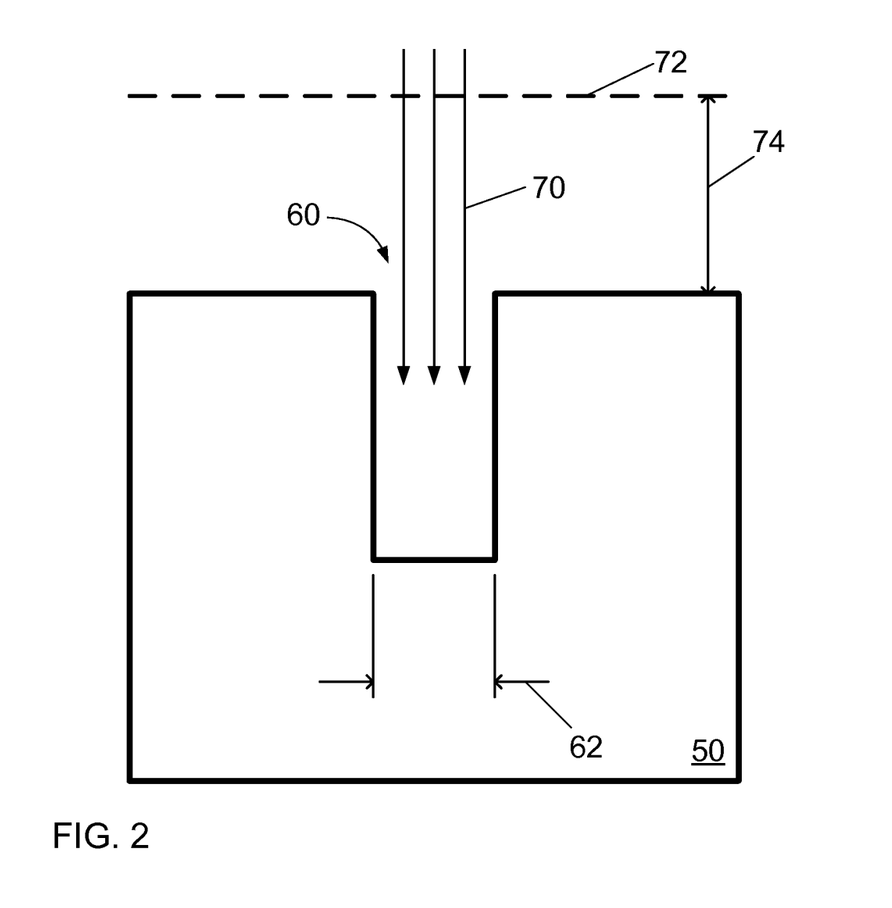
FIG. 2 provides a schematic illustration of an etching process according to an embodiment.

For example, FIG. 2 illustrates an etching process for large, high aspect ratio features using plasma having a population of negatively-charged ions. A feature 60 is etched into a substrate 50, wherein an ion flux 70 passes through plasma sheath 72, adjacent substrate 50, and assists the etching chemistry at the bottom of the feature 50. As shown in FIG. 2, the transverse dimension 62 of feature 50 is smaller than the thickness 74 of plasma sheath 72 and, therefore, the edge of plasma sheath 72 remains substantially unperturbed. Consequently, the ion trajectories of ion flux 70 are substantially unaffected by any sheath edge curvature and, hence, it is less likely that ion trajectories will intersect with the sidewalls of feature 60.

According to an embodiment, an etching system for producing continuous plasma having a population of negatively-charged ions is described. The etching system comprises a first chamber region for generating plasma using a first process gas, and a second chamber region separated from the first chamber region with a separation member. Electrons from plasma in the first chamber region are transported to the second chamber region to form quiescent plasma through collisions with the first process gas or a second process gas or both.

The term "quiescent" plasma is used herein to distinguish plasma formed in the second chamber region from plasma formed in the first chamber region. For instance, plasma is created in the first chamber region by coupling electromagnetic (EM) energy into the first process gas to heat electrons, while plasma is created in the second chamber region by transporting electrons from the first chamber region to the second chamber region to interact with the first process gas or the second process gas or both. Further, the first process gas or the second process gas or both comprise an electronegative specie.

A pressure control system coupled to the second chamber region is utilized to control the pressure in the second chamber region such that the electrons from the first chamber region undergo collision-quenching with the second process gas to form less energetic electrons that produce the quiescent plasma having negatively-charged ions.

Figure 3:
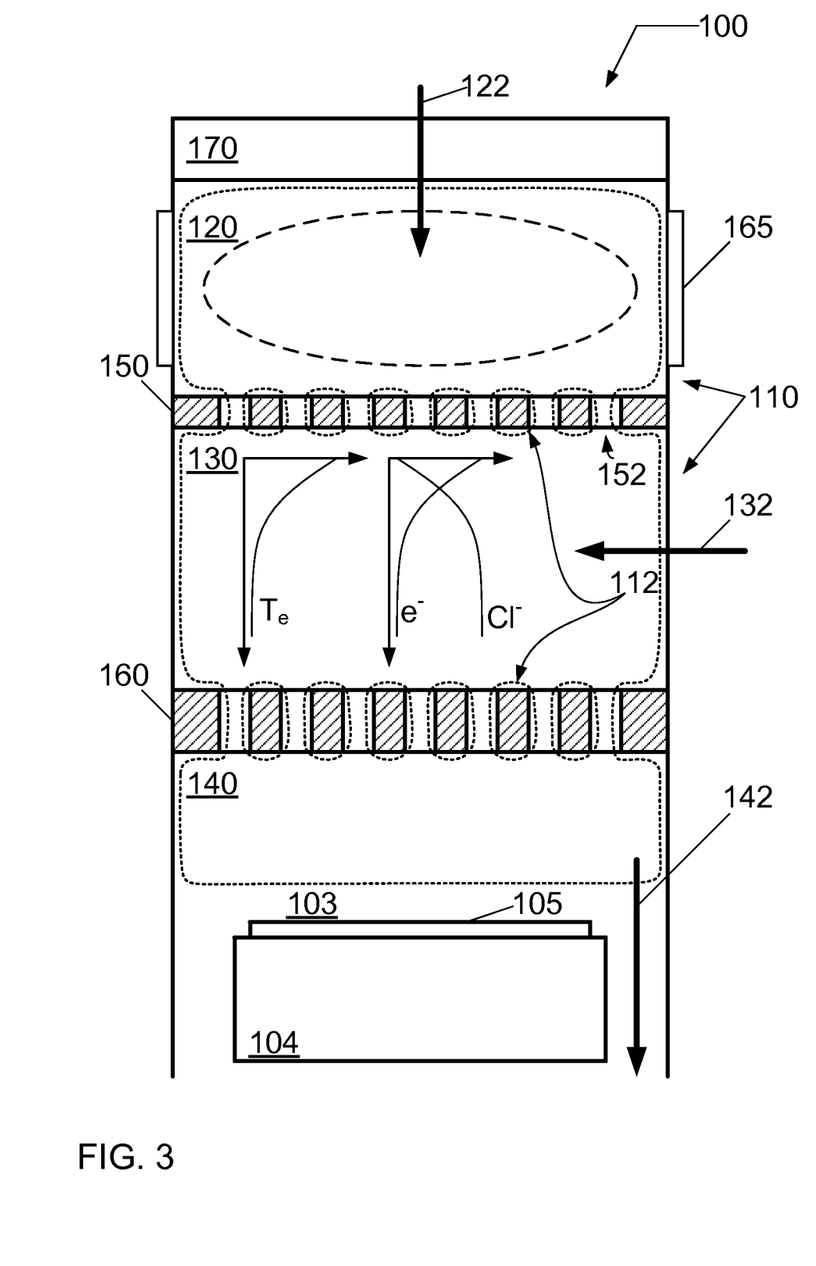
FIG. 3 illustrates a processing system for treating a substrate according to an embodiment.

The system may facilitate efficient production of negative ions (i.e., an ion-ion plasma) while allowing the creation of a (relatively) narrow energy spectrum for negative ions extracted from the plasma. Referring to FIG. 3, an etching system 100 is illustrated for etching a substrate 105 using negative ion plasma. The etching system 100 provides a substrate treatment region 103 for treating substrate 105 on a substrate holder 104.

The etching system 100 comprises a process chamber 110 comprising a first chamber region 120 configured to receive a first process gas 122 at a first pressure, and a second chamber region 130 disposed downstream of the first chamber region 120 and configured to receive an optional second process gas 132 at a second pressure. The first process gas 122 or the second process gas 132 or both comprises at least one electronegative gas. For example, the at least one electronegative gas may comprise a halogen-containing gas. A plasma generation system 170 is coupled to the first chamber region 120 and configured to form plasma (as indicated by the dashed line) from the first process gas 122.

Furthermore, as illustrated in FIG. 3, a plasma sheath 112 forms at the confining surfaces of the process chamber 110 (as indicated by the dotted line). As described above, the plasma sheath represents a boundary layer between the bulk plasma and a confining surface, such as a confining conductive surface. Generally, the plasma sheath follows closely the conductive surface that confines the plasma except near a discontinuity in the surface, such as the entrance to an aperture (e.g., an opening or orifice formed through the confining surface). The plasma sheath does not follow the aperture when the aperture size (i.e., transverse dimension or diameter) is less than the Debye length.

Referring still to FIG. 3, a separation member 150 is disposed between the first chamber region 120 and the second chamber region 130, wherein the separation member 150 comprises one or more openings 152 configured to allow transport of electrons from the plasma in the first chamber region 120 to the second chamber region 130 in order to form a quiescent plasma in the second chamber region 130. The openings 152 in the separation member 150 may comprise super-Debye length apertures, i.e., the transverse dimension or diameter is larger than the Debye length. The openings may be sufficiently large to permit adequate electron transport, and the openings may be sufficiently small to prevent or reduce electron heating across the separation member 150.

Additionally, a pressure control system (not shown) is coupled to the etching system 100 (see label 142), and configured to control the second pressure. Electrons from the first chamber region 120 may undergo collision-quenching with the second process gas to form less energetic electrons that produce the quiescent plasma with negatively-charged ions in the second chamber region.

Optionally, the etching system 100 may include a third chamber region 140 disposed downstream of the second chamber region 130. A pressure barrier 160 may be disposed between the second chamber region 130 and the third chamber region 140, and configured to produce a pressure difference between the second pressure in the second chamber region 130 and a third pressure in the third chamber region 140, the third pressure being less than the second pressure. The openings in the pressure barrier 160 may comprise super-Debye length apertures. The openings may be sufficiently small to allow a pressure difference between the second chamber region 130 and the third chamber region 140.

Optionally, the etching system 100 may comprise one or more electrodes 165 located about a periphery of the first chamber region 120 and configured to contact the plasma, or one or more electrodes (not shown) located about a periphery of the second chamber region 130. A power source may be coupled to the one or more electrodes 165 and configured to couple an electrical voltage to the one or more electrodes 165. The one or more electrodes 165 may include a powered cylindrical electrode configured to act as a cylindrical hollow-cathode. For example, the one or more electrodes 165 may be utilized to reduce the plasma potential of the plasma formed in the first chamber region 120 or reduce the electron temperature or both.

As illustrated in FIG. 3, electrons are transported from the first chamber region 120 to the second chamber region 130 through separation member 150. The electron transport may be driven by diffusion, or it may be driven by field-enhanced diffusion. As electrons emerge from the separation member 150 and enter the second chamber region 130, they undergo collisions with the first process gas 122 or the second process gas 132 or both, and lose energy, thereby causing the electron temperature ($T_e$) to decrease (as shown in FIG. 3). For illustration purposes, the first process gas 122 or the second process gas 132 or both comprise chlorine ($Cl_2$) as an electronegative gas.

When the electron temperature decreases, the electronegative gas specie(s) of the second process gas (e.g., $Cl_2$) undergoes (dissociative) electron attachment, viz.

$$Cl_2 + e \rightarrow Cl^- + Cl, \quad (3)$$

As the electron temperature decreases, the electron concentration ($e^-$) decreases and the concentration of negatively charged chlorine ions ($Cl^-$) increases (see the illustrations in FIG. 3). The electronegative gas specie(s) can be introduced with the second process gas 132, or it may be introduced with the first process gas 122.

Figure 4:
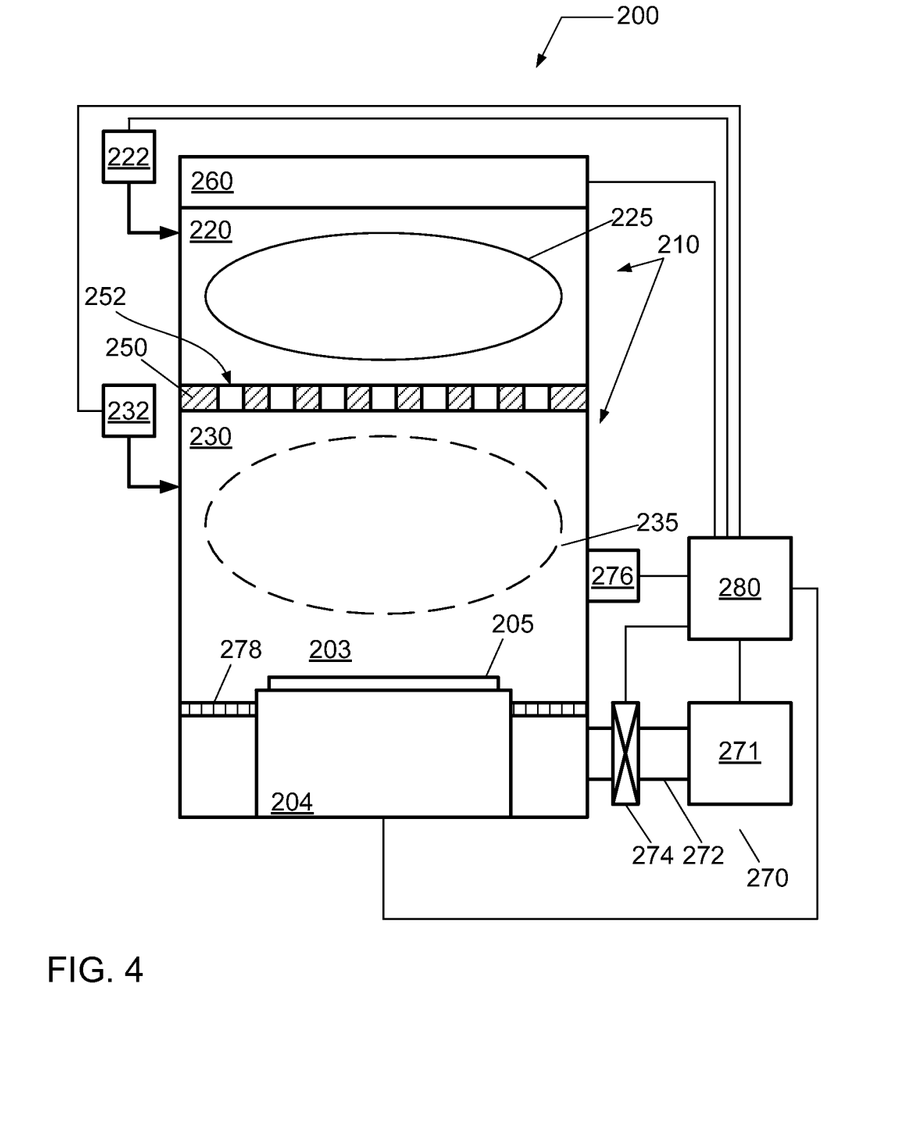
FIG. 4 illustrates a processing system for treating a substrate according to another embodiment.

Referring now to FIG. 4, an etching system 200 is provided for producing a negative ion plasma according to an embodiment. The etching system 200 comprises a process chamber 210 comprising a first chamber region 220 configured to receive a first process gas at a first pressure, and a second chamber region 230 disposed downstream of the first chamber region 220 and configured to receive an optional second process gas at a second pressure. Further, the etching system 200 provides a substrate treatment region 203 for treating substrate 205 on a substrate holder 204.

A first gas injection system 222 is coupled to the first chamber region 220, and configured to introduce the first process gas. The first process gas may comprise an electropositive gas (e.g. Ar or other noble gases) or an electronegative gas (e.g., $Cl_2$, etc.) or a mixture thereof. For example, the first process gas may comprise a noble gas, such as Ar. The first gas injection system 222 may include one or more gas supplies or gas sources, one or more control valves, one or more filters, one or more mass flow controllers, etc.

An optional second gas injection system 232 is coupled to the second chamber region 230, and configured to introduce the second process gas. The second process gas comprises at least one electronegative gas (e.g., $O_2$, $N_2$, $Cl_2$, HCl, $CCl_2F_2$, $SF_6$, $Br_2$, HBr, $F_2$, $NF_3$, or $ClF_3$, etc.). The second gas injection system 232 may include one or more gas supplies or gas sources, one or more control valves, one or more filters, one or more mass flow controllers, etc.

A plasma generation system 260 is coupled to the first chamber region 220 and configured to form plasma 225 (as indicated by the solid line) from the first process gas. The plasma generation system 260 comprises at least one of a capacitively coupled plasma source, an inductively coupled plasma source, a transformer coupled plasma source, a microwave plasma source, a surface wave plasma source, or a helicon wave plasma source.

For example, the plasma generation system 260 may comprise an inductive coil to which radio frequency (RF) power is coupled via a RF generator through an optional impedance match network. Electromagnetic (EM) energy at an RF frequency is inductively coupled from inductive coil through a dielectric window (not shown) to plasma 225. A typical frequency for the application of RF power to the inductive coil can range from about 10 MHz to about 100 MHz. In addition, a slotted Faraday shield (not shown) can be employed to reduce capacitive coupling between the inductive coil and plasma 225.

An impedance match network may serve to improve the transfer of RF power to plasma 225 by reducing the reflected power. Match network topologies (e.g. L-type, π-type, T-type, etc.) and automatic control methods are well known to those skilled in the art.

The inductive coil may include a helical coil. Alternatively, the inductive coil can be a "spiral" coil or "pancake" coil in communication with the plasma 225 from above as in a transformer coupled plasma (TCP). The design and implementation of an inductively coupled plasma (ICP) source, or transformer coupled plasma (TCP) source, is well known to those skilled in the art.

In an electropositive discharge, the composition of the plasma includes electrons and positively charged ions. Using a quasi-neutral plasma approximation, the number of free electrons is equivalent to the number of singly charged positive ions. As an example, in an electropositive discharge, the electron density may range from approximately $10^{10}$ cm$^{-3}$ to $10^{13}$ cm$^{-3}$, and the electron temperature may range from about 1 eV to about 10 eV (depending on the type of plasma source utilized).

Referring still to FIG. 4, a separation member 250 is disposed between the first chamber region 220 and the second chamber region 230, wherein the separation member 250 comprises one or more openings 252 configured to allow transport of electrons from plasma 225 in the first chamber region 220 to the second chamber region 230 in order to form a quiescent plasma 235 (indicated by dashed line) in the second chamber region 230. The one or more openings 252 in the separation member 250 may comprise super-Debye length apertures, i.e., the transverse dimension or diameter is larger than the Debye length. The one or more openings 252 may be sufficiently large to permit adequate electron transport, and the one or more openings 252 may be sufficiently small to prevent or reduce electron heating across the separation member 250.

In the second chamber region 230, the process chamber 210 and the separation member 250 may be fabricated from a dielectric material, such as $SiO_2$ or quartz. A dielectric material may minimize charge-loss and eliminate a current path through the process chamber 210.

Additionally, a pressure control system 270 is coupled to the etching system 200, and configured to control the second pressure. Electrons from the first chamber region 220 may undergo collision-quenching with the second process gas to form less energetic electrons that produce the quiescent plasma 235 with negatively-charged ions in the second chamber region 230. For example, the electrons emerging through the separation member 250 may have an electron temperature of about 1 eV and, when the electron temperature decreases to about 0.05 to about 0.1 eV, efficient negative ion production can occur. As illustrated in FIG. 4, the pressure control system 270 is coupled to the second chamber region 230; however, it may be coupled to the first chamber region 220, or it may be coupled to the first chamber region 220 and the second chamber region 230.

The pressure control system 270 comprises a pumping system 271 coupled to the process chamber 210 via a pumping duct 272, a valve 274 coupled to the pumping duct 272 and located between the pumping system 271 and the process chamber 210, and a pressure measurement device 276 coupled to the process chamber 210 and configured to measure the second pressure. A controller 280 coupled to the pressure measurement device 276, the pumping system 271 and the valve 274 may be configured to perform at least one of monitoring, adjusting or controlling the second pressure.

The pumping system 271 may include a turbo-molecular vacuum pump (TMP) capable of a pumping speed up to 5000 liters per second (and greater). In conventional plasma processing devices utilized for dry plasma etch, a 1000 to 3000 liter per second TMP can be employed. TMPs can be used for low pressure processing, typically less than 50 mTorr. For high pressure processing (i.e., greater than 100 mTorr), a mechanical booster pump and dry roughing pump can be used. The pressure measurement device 276 may be, for example, a relative or absolute capacitance manometer, such as one commercially available from MKS Instruments, Inc. (Andover, Mass.).

The pressure control system 270 may further comprise one or more exhaust plates 278 coupled to process chamber 210, through which process chamber 210 may be evacuated to reduced pressure (e.g., a vacuum pressure less than atmospheric pressure). The one or more exhaust plates 278 comprises one or more openings that may comprise a transverse dimension (or diameter) which is smaller than a Debye length (sub-Debye) or is larger than a Debye length (super-Debye). Additionally, the one or more exhaust plates 278 may be electrically biased or coupled to ground.

According to one example, the one or more exhaust plates 278 comprises one or more sub-Debye openings, and one or more exhaust plates 278 are electrically biased at a negative voltage. Positively charged ions and neutral gases may be pumped through the one or more exhaust plates 278. The one or more openings may, for instance, be approximately 1 mm in diameter and 3 mm in length.

According to another example, the one or more exhaust plates 278 comprises one or more super-Debye openings, and the one or more exhaust plates 278 are coupled to ground. Gases may be pumped through the one or more exhaust plates 278 with relatively high flow conductance.

The one or more exhaust plates 278 may be fabricated from a conductive material. For example, the one or more exhaust plates 278 may be fabricated from $RuO_2$ (ruthenium oxide) or Hf (hafnium).

Referring still to FIG. 4, etching system 200 further comprises controller 280 that comprises a microprocessor, memory, and a digital I/O port capable of generating control voltages sufficient to communicate and activate inputs to etching system 200 as well as monitor outputs from etching system 200. Moreover, controller 280 can be coupled to and can exchange information with the plasma generation system 260, the pressure control system 270, the first gas injection system 222, the optional second gas injection system 232, and the substrate holder 204. A program stored in the memory can be utilized to activate the inputs to the aforementioned components of etching system 200 according to a process recipe for forming negative ion plasma.

Controller 280 may be locally located relative to the etching system 200, or it may be remotely located relative to the etching system 200 via an internet or intranet. Thus, controller 280 can exchange data with the etching system 200 using at least one of a direct connection, an intranet, or the internet. Controller 280 may be coupled to an intranet at a customer site (i.e., a device maker, etc.), or coupled to an intranet at a vendor site (i.e., an equipment manufacturer). Furthermore, another computer (i.e., controller, server, etc.) can access controller 280 to exchange data via at least one of a direct connection, an intranet, or the internet.

Furthermore, embodiments of this invention may be used as or to support a software program executed upon some form of processing core (such as a processor of a computer, e.g., controller 280) or otherwise implemented or realized upon or within a machine-readable medium. A machine-readable medium includes any mechanism for storing information in a form readable by a machine (e.g., a computer). For example, a machine-readable medium can include a read only memory (ROM); a random access memory (RAM); a magnetic disk storage media; an optical storage media; and a flash memory device, etc.

As described above, etching system 200 comprises substrate holder 204 for supporting substrate 205 and provides substrate treatment region 203 for treating substrate 205 on a substrate holder 204. The substrate holder 204 can comprise a temperature control system having a cooling system or a heating system or both. For instance, the cooling system or heating system can include a re-circulating fluid flow that receives heat from substrate holder 204 and transfers heat to a heat exchanger system (not shown) when cooling, or transfers heat from the heat exchanger system to the fluid flow when heating. Additionally, for instance, the cooling system or heating system may comprise heating/cooling elements, such as resistive heating elements, or thermo-electric heaters/coolers located within the substrate holder 204.

Moreover, the substrate holder 204 can facilitate the delivery of heat transfer gas to the back-side of substrate 205 via a backside gas supply system to improve the gas-gap thermal conductance between substrate 205 and substrate holder 204. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 205.

In other embodiments, heating/cooling elements, such as resistive heating elements, or thermo-electric heaters/coolers can be included in the chamber wall of the process chamber 210 and any other component within the process chamber 210.

Further, the substrate holder 204 may be electrically biased. For example, the substrate holder 204 may be coupled to a RF generator through an optional impedance match network. A typical frequency for the application of power to the substrate holder 204 (or lower electrode) may range from about 0.1 MHz to about 100 MHz.

Figure 5:
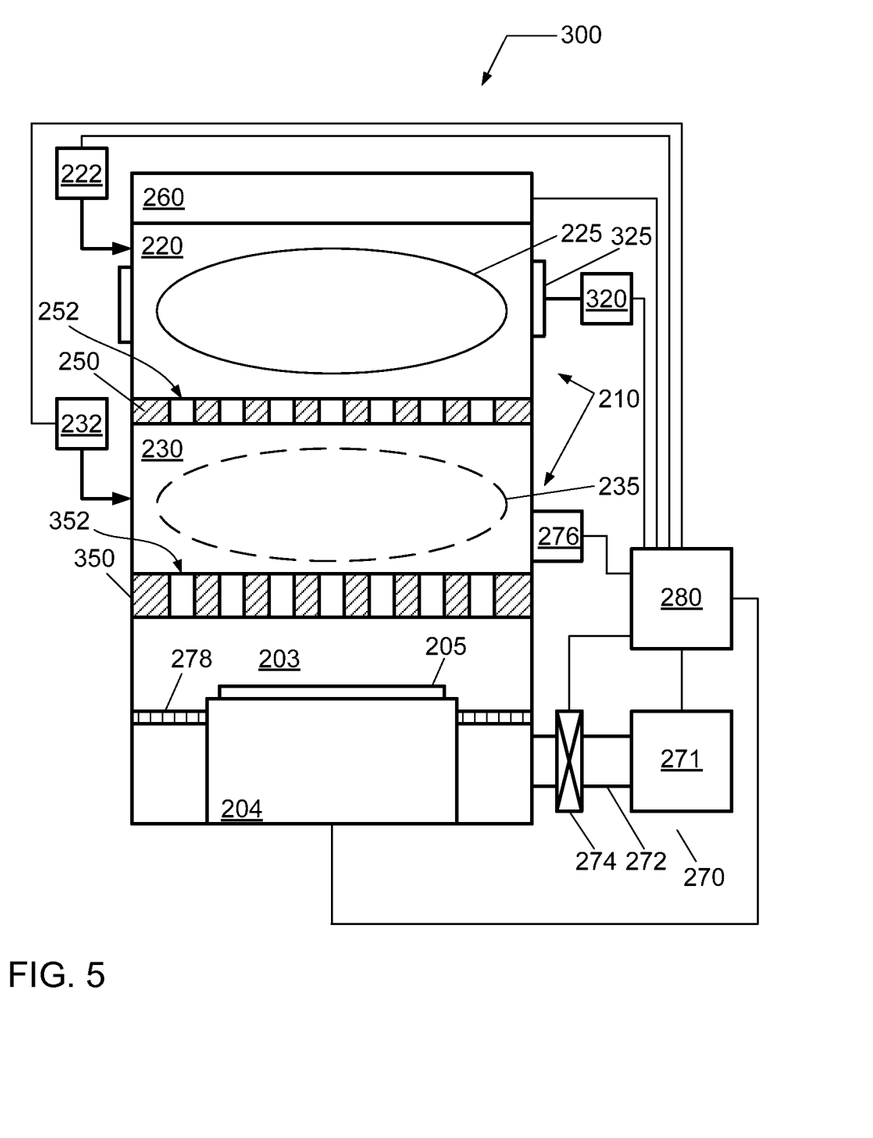
FIG. 5 illustrates a processing system according to another embodiment.

Referring now to FIG. 5, an etching system 300 is provided for producing a negative ion plasma according to an embodiment. The etching system 300 can be similar to the embodiment of FIG. 4 and further comprise one or more electrodes 325 located about a periphery of the first chamber region 220 and configured to contact plasma 225. A power source 320 is coupled to the one or more electrodes 325 and configured to couple an electrical voltage to the one or more electrodes 325. The one or more electrodes 325 may include a powered cylindrical electrode configured to act as a cylindrical hollow-cathode. For example, the one or more electrodes 325 may be utilized to reduce the plasma potential of plasma 225 formed in the first chamber region 220 or reduce the electron temperature or both.

The power source 320 may comprise a direct current (DC) power supply. The DC power supply can include a variable DC power supply. Additionally, the DC power supply can include a bipolar DC power supply. The DC power supply can further include a system configured to perform monitoring, adjusting, or controlling the polarity, current, voltage, or on/off state of the DC power supply or any combination thereof. An electrical filter may be utilized to de-couple RF power from the DC power supply.

For example, the DC voltage applied to the one or more electrodes 325 by power source 320 may range from approximately −5000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. For example, the DC voltage may range from about −1 V to about −5 kV, and desirably the DC voltage may range from about −1 V to about −2 kV.

Furthermore, it is desirable that the DC voltage is a negative voltage suitable for reducing the plasma potential of plasma 225 or reducing the electron temperature or both. For example, by reducing the plasma potential of plasma 225 relative to the plasma potential of quiescent plasma 235, electric field enhanced diffusion of electrons between the first chamber region 220 and the second chamber region 230 can occur. Furthermore, for example, by reducing the electron temperature of plasma 225, less collisions are required in the second chamber region 230 to produce electron energies for efficient production of negative ions.

The one or more electrodes 325 may be fabricated from a conductive material. For example, the one or more electrode 325 may be fabricated from $RuO_2$ or Hf.

Referring still to FIG. 5, the etching system 300 may further comprise a pressure barrier 350 may be disposed between the second chamber region 230 and the substrate treatment region 203, and configured to produce a pressure difference between the second pressure in the second chamber region 230 and a third pressure in the substrate treatment region 203, the third pressure being less than the second pressure. The pressure barrier 350 comprises one or more openings 352 that may comprise super-Debye length apertures. The one or more openings 352 may be sufficiently small to allow a pressure difference between the second chamber region 230 and the substrate treatment region 203. By introducing pressure barrier 350, the second pressure may be increased, which may be beneficial for efficient collision-quenching in the second chamber region 230.

The pressure barrier 350 may be fabricated from a dielectric material, such as $SiO_2$ or quartz.

According to an example, when producing negative ion (or ion-ion) plasma for treating a substrate in a substrate treatment region (e.g., substrate treatment region 103 in FIG. 3), the first pressure may range from about 10 mTorr to about 100 mTorr (e.g., about 50-70 mTorr); the second pressure may range from about 10 mTorr to about 100 mTorr (e.g., about 50-70 mTorr); and the third pressure may range from about 1 mTorr to about 100 mTorr (e.g., about 20-50 mTorr). A vacuum pumping system coupled to the substrate chamber region 103 may provide a pumping speed of about 1000 liters per second (l/sec), and a vacuum pumping system coupled to the substrate treatment region may provide a pumping speed of about 3000 l/sec. The flow conductance through the pressure barrier may be about 10 l/sec to about 500 l/sec (e.g., about 50 l/sec), and the flow conductance through the neutralizer grid may be about 100 l/sec to about 1000 l/sec (e.g., about 300 l/sec).

Figure 6:
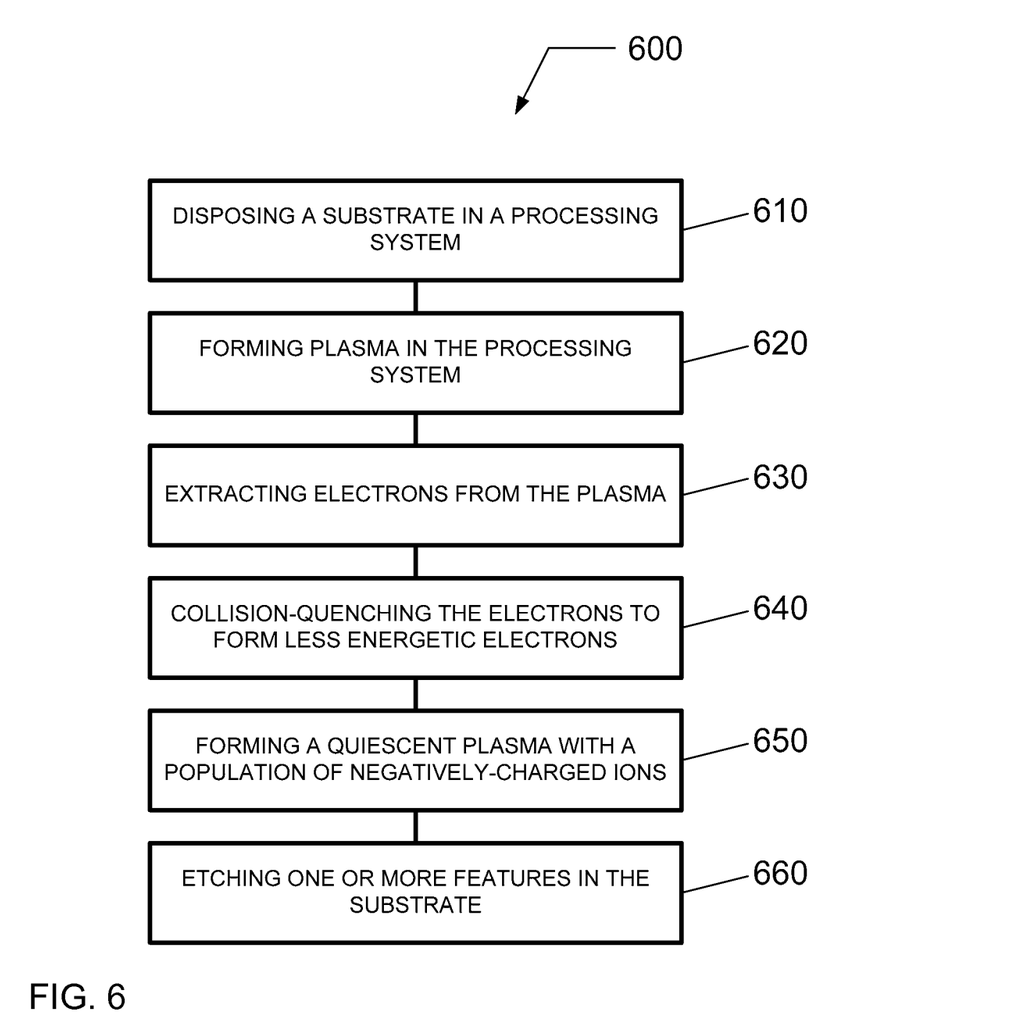
FIG. 6 presents a method of etching a substrate according to another embodiment.

Referring now to FIG. 6, a flow chart 600 is provided of a method of etching a substrate according to an embodiment. Flow chart 600 begins in 610 with disposing a substrate in a processing system configured to facilitate the treatment of the substrate using plasma. The processing system may include components of any one of the etching systems described in FIGS. 3, 4 and 5.

In 620, plasma is formed in the processing system. For example, plasma may be formed in a first chamber region.

In 630, electrons are extracted from the plasma. For example, the electrons may be extracted from the first chamber region and introduced to a second chamber region. Additionally, for example, the electrons may be extracted through a separation member disposed between the first chamber region and the second chamber region.

In 640, the extracted electrons undergo collision-quenching collisions with the background gas to form less energetic electrons. For example, collision-quenching may take place in the second chamber region. The background gas may include a first process gas introduced to the first chamber region, or a second process gas introduced to the second chamber region, or both. The first process gas, or the second process gas, or both may comprise an electronegative specie.

In 650, a quiescent plasma having a population of negatively-charged ions is formed. For example, the population of negative ions may be formed by dissociative electron attachment between less energetic electrons and the background gas.

In 660, the substrate is exposed to the population of negatively-charged ions in order to etch one or more features in the substrate. The one or more features may comprise a transverse dimension of 0.5 micron or greater. Alternatively, the one or more features may comprise a transverse dimension of 1 micron or greater. Alternatively, the one or more features may comprise a transverse dimension of 5 microns or greater. Alternatively, the one or more features may comprise a transverse dimension of 10 microns or greater. Alternatively yet, the one or more etched features facilitate formation of a micro-electromechanical (MEM) device. The feature aspect ratio may exceed about 1:1 (feature depth to feature transverse dimension). Alternatively, the feature aspect ratio may exceed about 2:1. Alternatively, the feature aspect ratio may exceed about 5:1. Alternatively, the feature aspect ratio may exceed about 10:1. Alternatively, the feature aspect ratio may exceed about 50:1.

Figure 7:
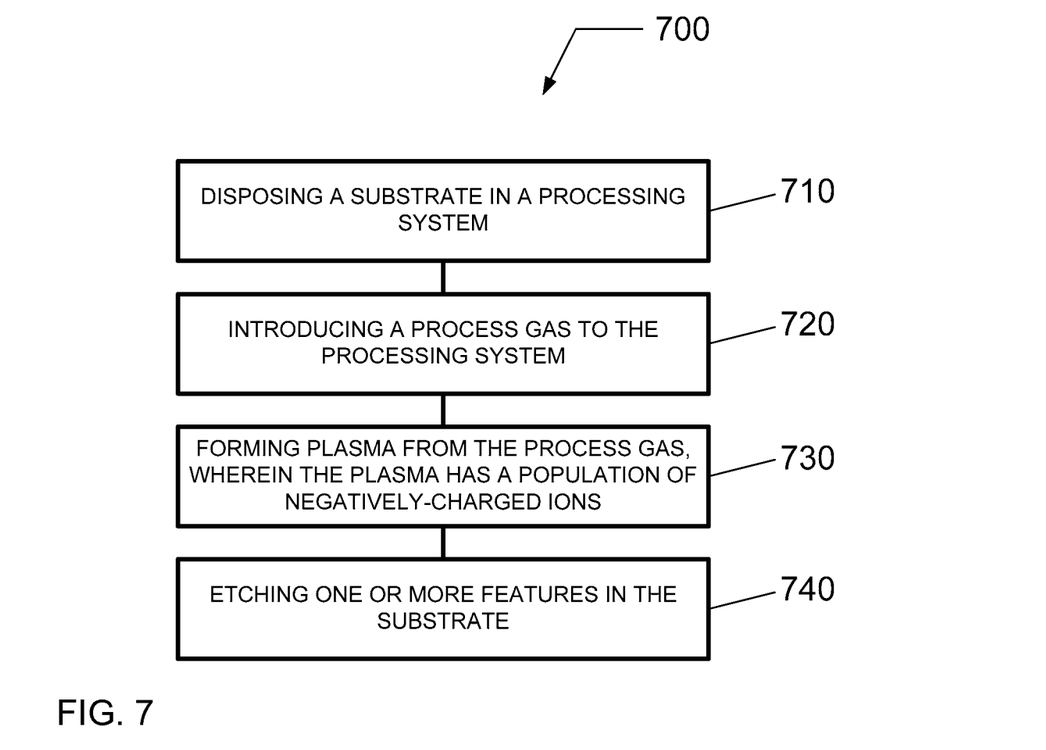
FIG. 7 presents a method of etching a substrate according to another embodiment.

Referring now to FIG. 7, a flow chart 700 is provided of a method of etching a substrate according to another embodiment. Flow chart 700 begins in 710 with disposing a substrate in a processing system configured to facilitate the treatment of the substrate using plasma. The processing system may include components of any one of the etching systems described in FIGS. 3, 4 and 5.

In 720, a process gas is introduced to the processing system. The process gas comprises an electronegative specie.

In 730, continuous plasma is formed from the process gas, wherein the continuous plasma comprises a population of negatively-charged ions.

In 740, the substrate is exposed to the population of negatively-charged ions in order to etch one or more features in the substrate. The one or more features may comprise a transverse dimension of 0.5 micron or greater. Alternatively, the one or more features may comprise a transverse dimension of 1 micron or greater. Alternatively, the one or more features may comprise a transverse dimension of 5 microns or greater. Alternatively, the one or more features may comprise a transverse dimension of 10 microns or greater. Alternatively yet, the one or more etched features facilitate formation of a micro-electromechanical (MEM) device. The feature aspect ratio may exceed about 1:1 (feature depth to feature transverse dimension). Alternatively, the feature aspect ratio may exceed about 2:1. Alternatively, the feature aspect ratio may exceed about 5:1. Alternatively, the feature aspect ratio may exceed about 10:1. Alternatively, the feature aspect ratio may exceed about 50:1.

Figure 8:
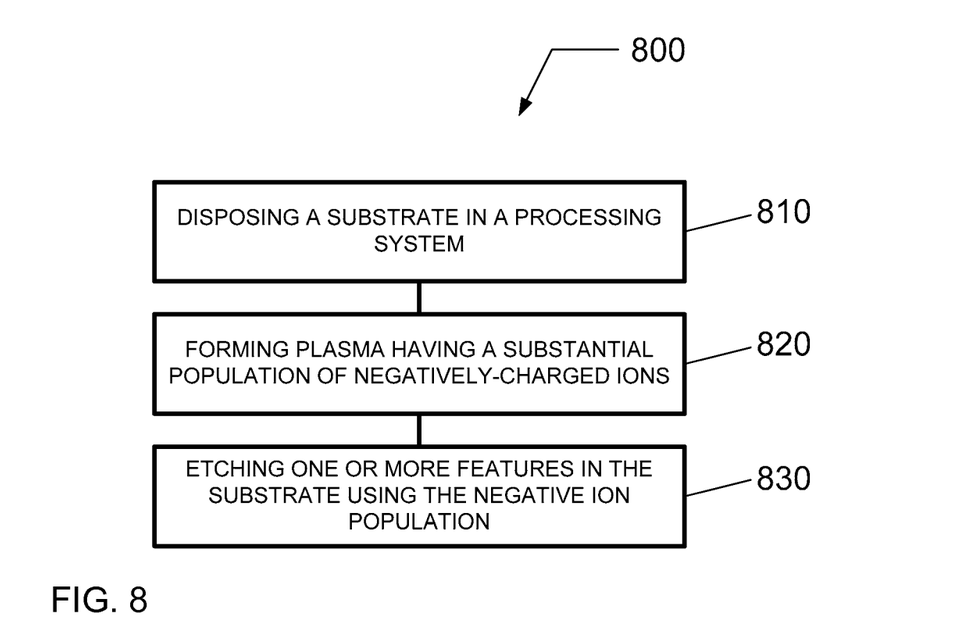
FIG. 8 presents a method of etching a substrate according to yet another embodiment.

Referring now to FIG. 8, a flow chart 800 is provided of a method of etching a substrate according to yet another embodiment. Flow chart 800 begins in 810 with disposing a substrate in a processing system configured to facilitate the treatment of the substrate using plasma. The processing system may include components of any one of the etching systems described in FIGS. 3, 4 and 5.

In 820, plasma is formed having a substantial population of negatively-charged ions. Plasma may comprise continuous plasma as described above. Alternatively, plasma may comprise pulse time modulated plasma. One example of pulse time modulated plasma is described in U.S. Patent Application Publication No. 2008/0085604A1, entitled "Plasma treatment method and plasma etching method".

In 830, one or more features are etched in the substrate using the negative ion population, wherein a critical dimension of the one or more etched features is greater than or equal to 1 micron, and wherein a plasma sheath thickness for the plasma adjacent the substrate is greater than or equal to the critical dimension.

Although only certain embodiments of this invention have been described in detail above, those skilled in the art will readily appreciate that many modifications are possible in the embodiments without materially departing from the novel teachings and advantages of this invention. For example, the description has been written in the context of an etching system; however, the same or similar embodiments are applicable to plasma assisted deposition. Accordingly, all such modifications are intended to be included within the scope of this invention.

What is claimed is:

1. A method of etching a substrate, comprising:
    disposing a substrate in a processing system, said processing system comprising a first chamber region, a second chamber region, and a substrate treatment region, wherein a separation member is disposed between said first chamber region and said second chamber region, said first chamber region having a first pressure, said second chamber region having a second pressure, said substrate treatment region having a third pressure;
    forming plasma in said first chamber region;
    extracting electrons from said plasma;
    collision-quenching said electrons in order to form less energetic electrons;
    forming a quiescent plasma with a population of negatively-charged ions using said less energetic electrons in said second chamber region; and
    etching one or more features in said substrate by exposing said substrate to said population of negatively-charged ions in said quiescent plasma;
    wherein said forming plasma further comprises:
    providing a first process gas for said forming said plasma, wherein said first process gas comprises as an incipient constituent a noble gas; and
    disposing a pressure barrier between said second chamber region and said substrate treatment region;
    wherein said pressure barrier is configured to produce a controlled pressure differential between said second chamber region and said substrate treatment region, said pressure barrier comprising one or more openings therethrough to permit adjusting said second pressure for efficient collision quenching in said second chamber region,
    wherein controlling the pressure differential to achieve efficient said collision-quenching of said electrons is performed using a pressure control system;
    wherein said separation member comprise openings sufficiently large to permit electron extraction and sufficiently small to prevent electron heating across said separation member; and
    wherein said first chamber region having a first power source, said first power source being a direct current (DC) negative voltage in order to reduce a plasma potential of said plasma or to reduce electron temperature of said plasma or both.

2. The method of claim 1, wherein said one or more etched features facilitate formation of a micro-electromechanical (MEM) device.

3. The method of claim 1, wherein a critical dimension of said one or more etched features is greater than or equal to 1 micron.

4. The method of claim 1, wherein a critical dimension of said one or more etched features is greater than or equal to 5 microns.

5. The method of claim 1, wherein a critical dimension of said one or more etched features is greater than or equal to 10 microns.

6. The method of claim 1, wherein said first process gas comprises an electronegative gas specie.

7. The method of claim 1, wherein said first process gas comprises a halogen-containing gas.

8. The method of claim 1, further comprising:
providing a second process gas for said forming said quiescent plasma, wherein said second process gas comprises an electronegative gas specie.

9. The method of claim 8, wherein said second process gas comprises a halogen-containing gas.

10. The method of claim 8, wherein said second process gas comprises $Cl_2$, HCl, $CCl_2F_2$, $SF_6$, $Br_2$, HBr, $F_2$, $NF_3$, or $ClF_3$, or any combination of two or more thereof.

11. The method of claim 1, wherein said forming said quiescent plasma comprises forming continuous quiescent plasma.

12. A method of etching a micro-electromechanical (MEM) device, comprising:
disposing a substrate in a processing system, the substrate including a MEM device, said processing system comprising a first chamber region, a second chamber region, and a substrate treatment region, wherein a separation member is disposed between said first chamber region and said second chamber region, said first chamber region having a first pressure, said second chamber region having a second pressure, said substrate treatment region having a third pressure;
introducing a process gas to said processing system, said process gas having a halogen-containing gas;
forming plasma in said processing system;
extracting electrons from said plasma;
collision-quenching said electrons in order to form less energetic electrons; forming quiescent plasma from said process gas, said plasma comprising a population of negatively-charged ions;
disposing a pressure barrier between said second chamber region and said substrate treatment region, wherein said pressure barrier is configured to produce a controlled pressure differential between said second chamber region and said substrate treatment region, said pressure barrier comprising one or more openings therethrough to permit adjusting said second pressure for efficient collision quenching in said second chamber region and wherein controlling the pressure differential to achieve efficient said collision-quenching of said electrons is performed using a pressure control system; and
etching one or more features in said substrate by exposing said substrate to said population of negatively-charged ions;
wherein controlling the pressure differential to achieve efficient said collision-quenching of said electrons is performed using a pressure control system;
wherein said separation member comprise openings sufficiently large to permit electron extraction and sufficiently small to prevent electron heating across said separation member; and
wherein said first chamber region having a first power source, said first power source being a direct current (DC) negative voltage in order to reduce a plasma potential of said plasma or to reduce electron temperature of said plasma or both.

13. The method of claim 12, wherein said one or more etched features facilitate formation of the MEM device.

14. The method of claim 12, wherein a critical dimension of said one or features is greater than or equal to 1 micron.

15. A method of etching a substrate, comprising:
disposing a substrate in a processing system, said processing system comprising a first chamber region, a second chamber region, and a substrate treatment region, wherein a separation member is disposed between said first chamber region and said second chamber region, said first chamber region having a first pressure, said second chamber region having a second pressure, said substrate treatment region having a third pressure;
introducing a process gas to said processing system, said process gas having a halogen-containing gas;
forming a plasma in said processing system;
extracting electrons from said plasma;
collision-quenching said electrons in order to form less energetic electrons;
forming a quiescent plasma from said process gas, said plasma comprising a population of negatively-charged ions;
disposing a pressure barrier between said second chamber region and said substrate treatment region, wherein said pressure barrier is configured to produce a controlled pressure differential between said second chamber region and said substrate treatment region, said pressure barrier comprising one or more openings therethrough to permit adjusting said second pressure for efficient collision quenching in said second chamber region and wherein controlling the pressure differential to achieve efficient said collision-quenching of said electrons is performed using a pressure control system; and
etching one or more features in said substrate using said negatively-charged ions, wherein a critical dimension of said one or more etched features is greater than or equal to 1 micron, and wherein a plasma sheath thickness for said plasma adjacent said substrate is greater than or equal to said critical dimension;
wherein said separation member comprise openings sufficiently large to permit electron extraction and sufficiently small to prevent electron heating across said separation member; and
wherein said first chamber region having a first power source, said first power source being a direct current (DC) negative voltage in order to reduce a plasma potential of said plasma or to reduce electron temperature of said plasma or both.

16. The method of claim 15, wherein said plasma comprises a continuous plasma or a pulse-modulated plasma.

* * * * *